United States Patent [19]

Kawagoe et al.

[11] Patent Number: 4,811,690
[45] Date of Patent: Mar. 14, 1989

[54] THIN FILM DEPOSITION APPARATUS

[75] Inventors: Yasuyuki Kawagoe; Kenichirō Yamanishi; Seiji Yasunaga, all of Amagasaki, Japan

[73] Assignee: Mitsubishi Denki Kabushiki Kaisha, Japan

[21] Appl. No.: 173,597

[22] Filed: Mar. 25, 1988

[30] Foreign Application Priority Data

Jun. 9, 1987 [JP] Japan .................. 62-142243

[51] Int. Cl.$^4$ .............................................. C23C 14/00
[52] U.S. Cl. ............................ 118/723; 204/192.31; 204/298; 427/38
[58] Field of Search ............... 118/723; 204/192.31, 204/298; 427/38

[56] References Cited

U.S. PATENT DOCUMENTS 4,152,478  5/1979  Takagi .................................. 428/221
4,451,499  5/1984  Morimoto ........................... 118/723
4,622,236  11/1986  Morimoto ....................... 204/192.31

Primary Examiner—Richard Bueker
Attorney, Agent, or Firm—Leydig, Voit & Mayer

[57] ABSTRACT

A thin film deposition apparatus includes an ionizing means for ionizing part of clusters from a vapor generating source by the cluster ion beam method. The ionizing means has an ionizing filament for emitting thermoelectrons to ionize the clusters, an electron extracting electrode for accelerating the thermoelectrons toward the clusters, and an electron controlling electrode disposed on the side of the electron extracting electrode for controlling the presence of the thermoelectrons at the center of the ionizing section. The thermoelectrons are substantially eliminated in the vicinity of the center of the ionizing portion due to the provision of the thermoelectron extracting electrode, thereby substantially eliminating the cluster ions generated in the vicinity of the center of the ionizing portion and reducing the quantity of clusters that concentrate on the center of a substrate. This makes the ion distribution on the substrate uniform so as to enable formation of a thin film which is uniform in terms of film thickness and film quality.

10 Claims, 7 Drawing Sheets

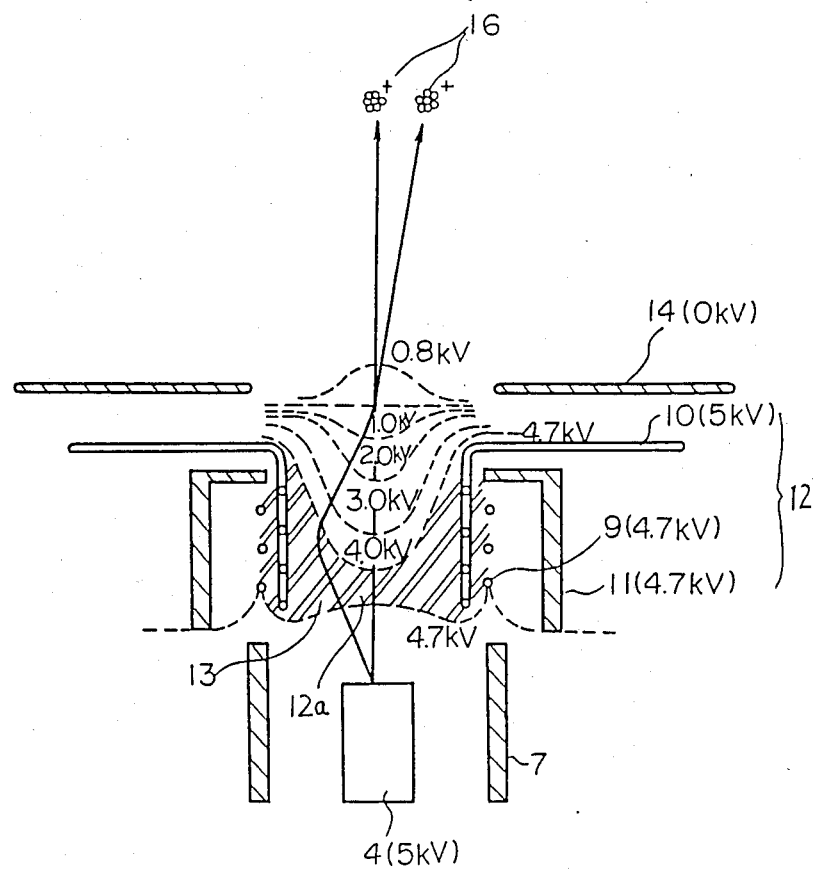

THIN FILM DEPOSITION APPARATUS

BACKGROUND OF THE INVENTION

1. Field of the Invention:

The present invention relates to a thin film deposition apparatus, and, more particularly, to a thin film deposition apparatus for forming a thin film by the cluster ion beam deposition method.

2. Description of the Prior Art:

A thin film deposition method employing the cluster ion beam deposition method has been proposed in, for example, the specification of Japanese Patent Publication No. 9592/1979. In such a method, vapors of a substance to be deposited on a substrate are ejected within a vacuum chamber as clusters in each of which a large number of atoms in the stream are loosely combined. These clusters are bathed with a shower of electrons so as to generate cluster ions in each of which an atom is ionized, and these cluster ions are caused to accelerate and collide with the substrate, by means of which a thin film is formed on the substrate.

FIG. 1 shows a known thin film deposition apparatus which is used to carry out such a thin film deposition method. In the apparatus, a vacuum chamber 1 in which a predetermined degree of vacuum is maintained is provided with an evacuation passage 2 through which the vacuum chamber is evacuated. The evacuation passage 2 is connected to an evacuation device (not shown), and is opened and closed by means of a vacuum valve 3. A sealed crucible 4 in the vacuum chamber 1 has a nozzle 4a having a diameter of 1 mm to 2 mm. It contains a substance which is to be evaporated so as to be deposited on the substrate, e.g., zinc (Zn) 5. A bombarding filament 6 for irradiating thermoelectrons on the crucible 4 so as to heat it is disposed in such a manner as to surround the sealed crucible 4. A heat shielding plate 7 which acts as a shield against the radiant heat from the filament 6 is provided around the filament 6. The crucible 4, the bombarding filament 6, and the heat shielding plate 7 form in combination a vapor generating source 8 for generating clusters which is achieved by ejecting the vapors of a substance to be deposited on the substrate within the vacuum chamber 1.

An ionizing filament 9 located above the vapor generating source 8 is heated by a power source (not shown), whereupon it emits thermoelectrons 13 to ionize the clusters formed of the vapors of the substance to be deposited on the substrate. An electron extracting elctrode 10 is adapted to accelerate the thermoelectrons 13 emitted from the ionizing filament 9. The radiant heat from the ionizing filament 9 is intercepted by a heat shielding plate 11 provided adjacent to the heat shielding plate 7 through an insulated supporting member 23. The ionizing filament 9, the electron extracting electrode 10, and the heat shielding plate 11 form in combination an ionizing means 12 for ionizing the clusters emitted from the vapor generating source 8. The inner side of the ionizing filament 9 forms an ionizing section 12a.

An accelerating electrode 14 serves to accelerate the ionized cluster ions 16, which, together with non-ionized neutral clusters 15, causes them to collide against a substrate 18 so as to deposit a thin film on the substrate 18. A potential can be generated between the accelerating electrode 14 and the electron extracting electrodes 10. In addition, a cluster beam 17 consists of the cluster ions 16 and the neutral clusters 15. The crucible 4 is supported by a support 20, and the support 20 and the heat shielding plate 7 are supported by the vacuum chamber 1 through an insulated supporting member 19. The accelerating electrode 14 is disposed adjacent to the ionizing means with an insulated supporting member 24 interposed therebetween. The substrate 18 is supported by a substrate holder 22, and the substrate holder 22 is in turn supported by the vacuum chamber 1 through an insulated supporting member 21.

With the thus-arranged thin film deposition apparatus, a thin film of, for example, zinc is deposited on the substrate 18 as follows: first, the zinc is charged in the crucible 4 as the substance to be deposited on the substrate, then the vacuum chamber 1 is evacuated by the evacuating device until the interior of the vacuum chamber 1 exhibits a degree of vacuum of about $10^{-6}$ mm Hg. Next, the bombarding filament 6 is energized so as to be heated. The temperature of the zinc 5 contained in the crucible 4 rises due to the radiant heat from the bombarding filament 6 or the collision of the thermoelectrons emitted from the filament 6 with the crucible 4, i.e., by electron impact, to a point (500° C.) at which the vapor pressure thereof is about 0.1 to 10 mm Hg. As a result, zinc vapors are ejected from the nozzle 4a, adiabatically expand due to the difference in the pressures in the crucible 4 and the vacuum chamber 1, and thereby form clusters in each of which a large number of atoms are loosely combined.

The thus-formed cluster beam 17 is caused to collide with the thermoelectrons extracted from the ionizing filament 9 by the electron extracting electrode 10. In consequence, one of the atoms in each of the clusters which constitute part of the cluster beam 17 is ionized, thereby forming a cluster ion 16. The cluster ions 16 are accelerated by an appropriate degree by means of the electric field generated between the accelerating electrode 14 and the electron extracting electrode 10. The accelerated cluster ions 16 collide with the substrate 18, as the neutral clusters 15 collide with the substrate 18 by virtue of the kinetic energy with which they are imparted as they are ejected from the crucible 4, whereupon a thin zinc film is deposited on the substrate 18. FIG. 2 is a perspective view showing the state in which the cluster beam 17 collides with the substrate 18.

FIG. 3 shows the electric potentials in the components located in the vicinity of the ionizing means 12, as well as the potential distribution in the space located in the vicinity of the ionizing means 12 in the known thin film deposition apparatus. The broken lines in FIG. 3 denote potential contours representing 0.8 kV, 1.0 kV, . . . , 4.0 kV, 4.7 kV, and the numbers in parentheses designate the electric potentials in the components of this thin film deposition apparatus. These contours are obtained by calculations. The hatched area represents an area surrounded by the contour (4.7 kV) of the same potential as that of the ionizing filament 9 and in which area thermoelectrons can exist.

In the above-described known thin film deposition apparatus, the thermoelectrons 13 exist in the vicinity of the center of the ionizing portion 12a as well, as can be seen from FIG. 3. Therefore, the cluster ions 16 become concentrated on the center of the substrate 18 when they reach the substrate. This results in a non-uniform ion distribution, which leads to formation of a non-uniform thin film in terms of film thickness and film quality.

SUMMARY OF THE INVENTION

The present invention is directed to obviating the aforementioned problems of the prior art, and its object is to provide a thin film deposition apparatus which is capable of eliminating the thermoelectrons 13 existing in the vicinity of the center of an ionizing portion, and which is thereby capable of reducing the extent to which the ions concentrate at the center of a substrate so as to enable formation of a uniform thin film in terms of film thickness as well as film quality.

Another object of the present invention is to provide a thin film deposition apparatus which is capable of making cluster ions which would otherwise reach the space surrounding the substrate and be discarded within reach of the substrate so as to increase the efficiency of use of the cluster ions and ensure uniform distribution of ions on the substrate.

To this end, the present invention provides a thin film deposition apparatus which comprises: a vacuum chamber; a substrate provided within the vacuum chamber; a vapor generating source for ejecting vapors of a substance to be deposited on the substrate into the vacuum chamber and thereby generating clusters in each of which a large number of atoms in the vapors are loosely combined; an ionizing means for ionizing part of the clusters from the vapor generating source; and an accelerating electrode for accelerating the ionized cluster ions and causing them to collide with the substrate together with non-ionized neutral clusters so as to deposit a thin film, wherein the ionizing means includes an ionizing filament for emitting thermoelectrons to ionize the clusters, an electron extracting electrode for accelerating the thermoelectrons toward the clusters, and an electron controlling electrode disposed on the side of the electron extracting electrode which is closer to the center of the ionizing portion in such a manner as to face the electron extracting electrode for the purpose of controlling the presence of thermoelectrons at the center of the ionizing portion.

In one form of the invention, the thermoelectrons existing in the vicinity of the center of the ionizing portion are substantially eliminated by means of a mesh electrode so as to substantially eliminate the cluster ions generated near the center and thereby decrease the quantity of clusters that concentrate at the center of the substrate. As a result, the distribution of ions on the substrate can be made uniform, and a thin film which is formed on the substrate can be made uniform in terms of film thickness and film quality.

In another form of the invention, the thin film deposition apparatus includes a truncated conical or truncated pyramidal mesh electrode having an accelerating electrode side aperture which is different from a crucible side aperture. In consequence, the action of the electric field which affects the cluster ions generated in the ionizing section and which is directed toward the center in a plane perpendicular to the direction of movement of the neutral clusters is decreased, increasing the quantity of ions which reach the substrate and decreasing the quantity of ions which reach the space surrounding the substrate and which are discarded as waste. This increases the efficiency with which cluster ions are used and ensures a uniform thin film.

BRIEF DESCRIPTION OF THE DRAWINGS

The present invention will be more readily apparent from the following detailed description of a few preferred embodiments thereof when taken in conjunction with the accompanying drawings, in which:

FIG. 3 is a schematic view showing the distribution of electric potential in the components located in the vicinity of an ionizing means of the known thin film deposition apparatus;

DESCRIPTION OF THE PREFERRED EMBODIMENTS

Figure 1:
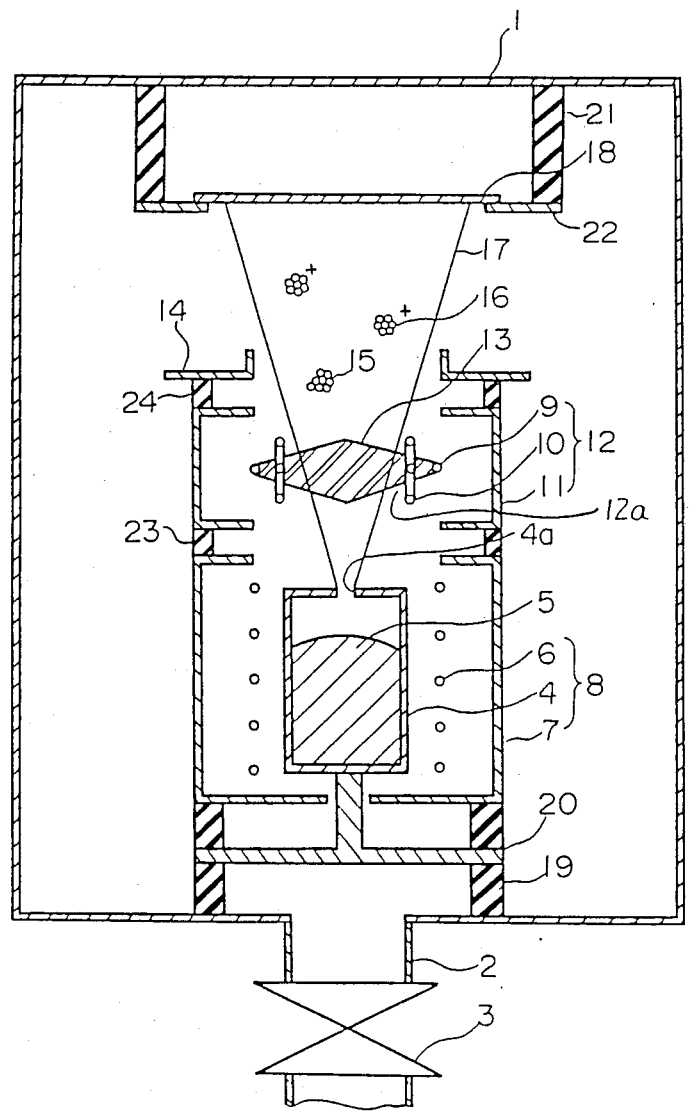
FIG. 1 is a cross-sectional view of a known thin film deposition apparatus.
Figures 2, 4:
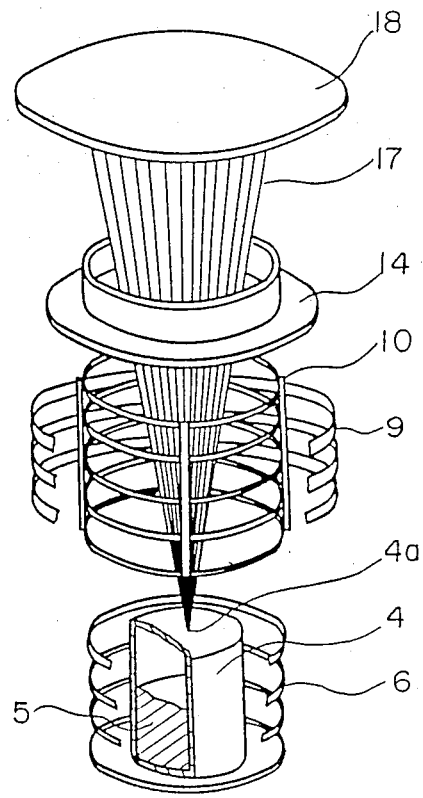
FIG. 2 is a perspective view showing the state in which a cluster beam 17 is caused to collide with a substrate in the apparatus of FIG. 1.
FIG. 4 schematically shows the distribution of electric potentials in the vicinity of the ionizing means of a thin film deposition apparatus, showing a first embodiment of the present invention.

FIG. 4 shows the electric potential distribution in the vicinity of an ionizing means of a first embodiment of a thin film deposition apparatus according to the present invention, in which the same reference numerals as those in FIGS. 1 to 3 are used to denote parts which are the same. An electron controlling electrode 30 having the same electric potential as that of the ionizing filament 9 is disposed on the side of the electron extracting electrode 10 which is closer to the center of the ionizing portion 12a in such a manner as to face the electron extracting electrode 10. The thermoelectron screening electrode 30 is preferably a mesh electrode 30, and it is therefore referred to hereinafter as a mesh electrode 30. The mesh electrode 30 is made of tungsten.

In this apparatus, the clusters are generated in the same manner as in the known thin film deposition apparatus. However, the distribution of electric potentials and the area in which thermoelectrons exist are changed due to the provision of the mesh electrode 30.

The broken lines in FIG. 4 denote electric potential contours obtained by calculation. The mesh electrode 30 is provided within the ionizing portion 12a on the side of the electron extracting electrode 10 which is closer to the center of the ionizing portion 12a in such a manner as to face it, and the same potential is applied to it as to the ionizing filament 9. In consequence, the themoelectrons 13 which exist in the vicinity of the center of the ionizing portion 12a can be substantially eliminated, thereby substantially eliminating the clusters ionized in the vicinity of the center of the ionizing portion 12a. As a result, the quantity of clusters that is concentrated at the center of the substrate is reduced, and uniform distribution of the cluster ions is ensured.

Figure 5:
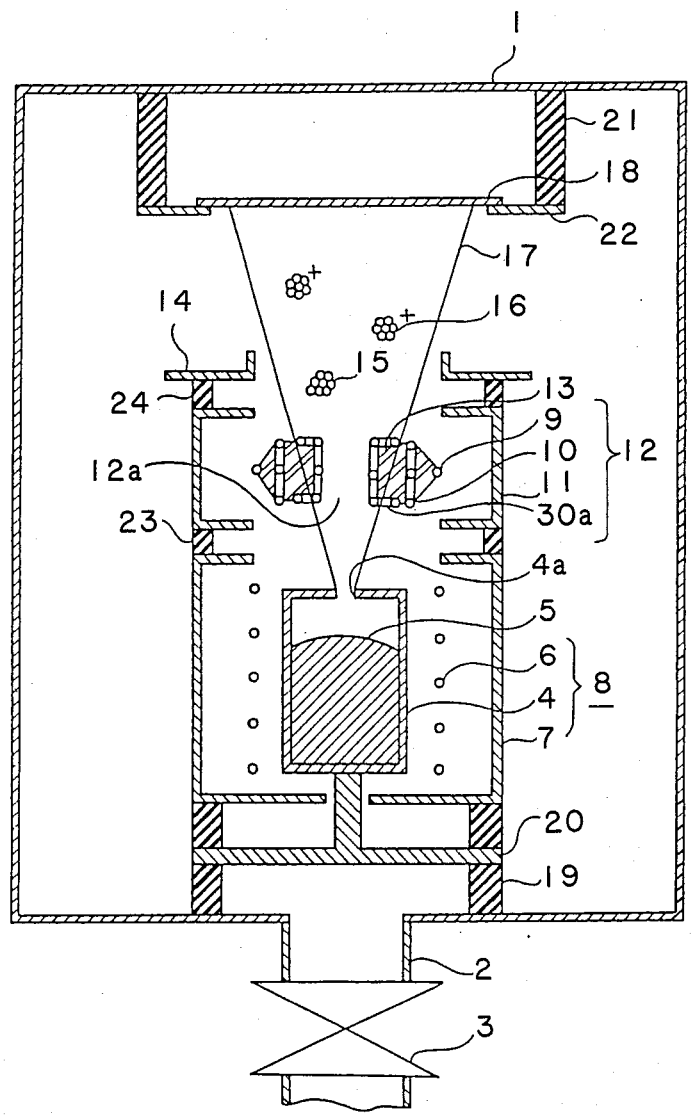
FIG. 5 is a cross-section of a thin film desposition apparatus, showing another embodiment of the present invention.

FIG. 5 is a cross-sectional view of a thin film deposition apparatus, showing a second embodiment of the present invention. In this embodiment, the ends of a mesh electrode 30a are bent outwardly so as to allow the area in which the thermoelectrons exist to be further limited. Other parts are identical with those of the apparatus shown in FIG. 1.

Figure 6:
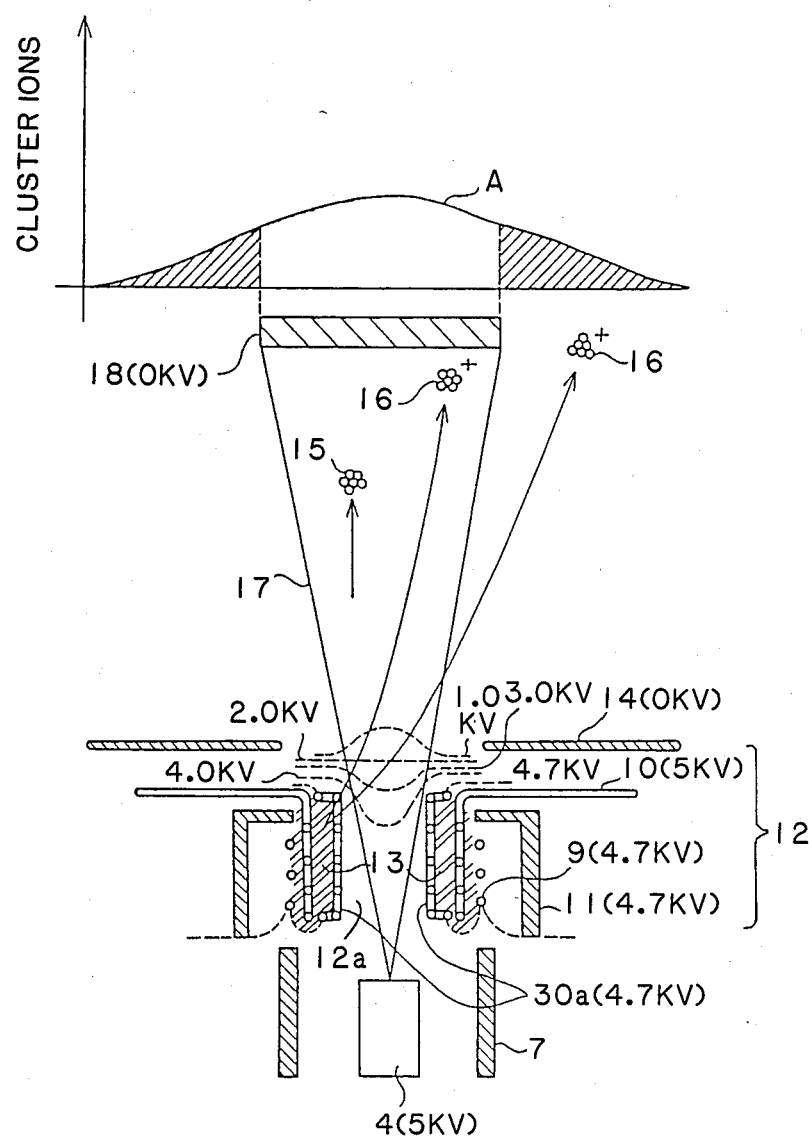
FIG. 6 is a schematic view showing a distribution of the electric potential in the components located in the vicinity of the ionizing means and on a substrate of the apparatus of FIG. 5, as well as a distribution of the quantity of cluster ions on the substrate.

FIG. 6 shows the electric potential disbribution in the components located in the ionizing portion 12a and on the substrate 18 of the thin film deposition apparatus shown in FIG. 5, as well as the distribution of the quantity of cluster ions positioned on the substrate 18. The broken lines in FIG. 6 denote the potential contours representing 1.0 kV, 2.0 kV, . . . 4.0 kV, 4.7 kV, and a curve A designates the distribution curve of the quantity of cluster ions. The numbers in parentheses denote the potentials in the components of the thin film deposition apparatus. The hatched area within the ionizing portion denotes an area surrounded by the mesh electrode 30 having the same potential as that of the ionizing filament 9 and the contour (4.7 kV) and in which area thermoelectrons can exist.

Figure 7:
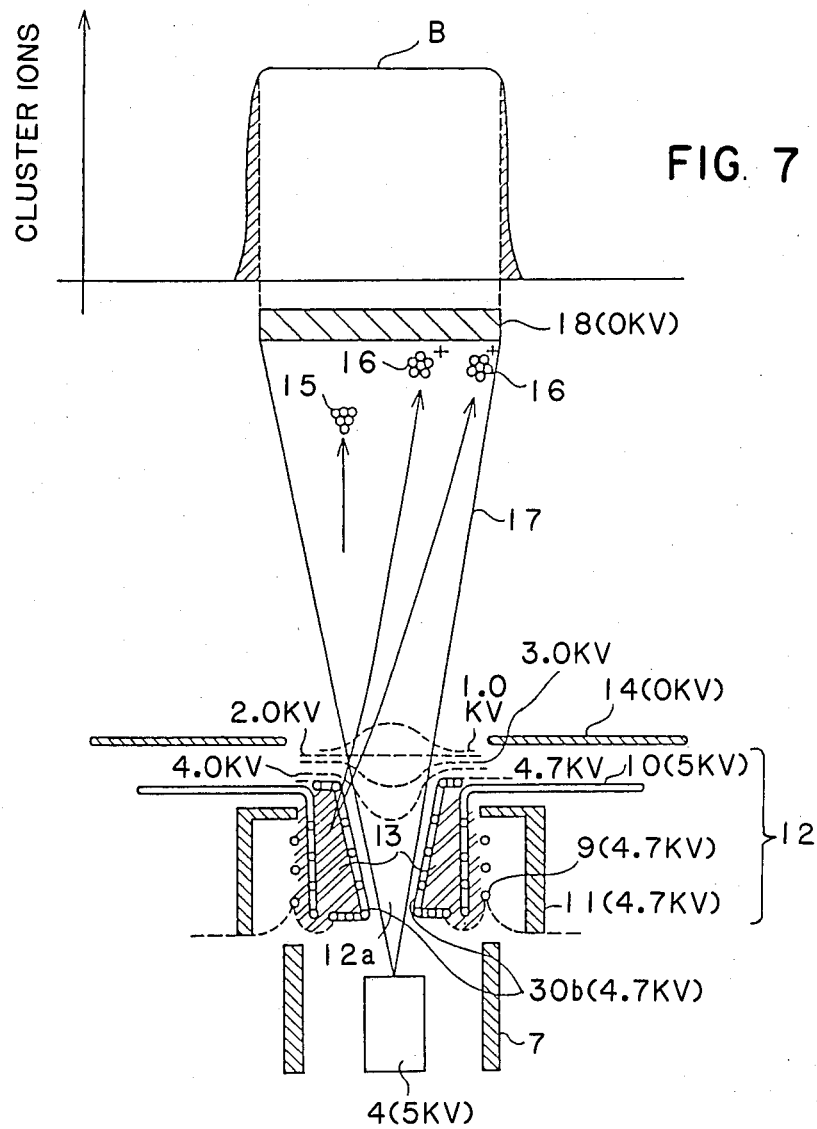
FIG. 7 schematically shows the electric potential distribution in the components located in the vicinity of the ionizing means and on the substrate of a thin film deposition apparatus, as well as the distribution of the quantity of cluster ions on the substrate, showing a third embodiment of the present invention.

FIG. 7 shows the electric potential distribution in the components located in the vicinity of the ionizing means and on the substrate of a third embodiment of the thin film deposition apparatus according to the present invention, as well as the distribution of the quantity of cluster ions which are positioned on the substrate (a curve B). In the embodiment shown in FIG. 7, a mesh electrode 30b has a truncated conical shape, the mesh electrode 30b having an accelerating electrode 14 side aperture which is different in size from a crucible 4 side aperture. In other words, the accelerating electrode 14 side aperture is made larger than the crucible 4 side aperture. In FIG. 7, the same reference numerals are used to denote parts which are the same as those of FIGS. 5 and 6.

The broken lines in FIG. 7 denote the electric potential contours obtained by calculation. The cluster ions generated in the hatched area within the ionizing portion 12a (an ionizing area) are subjected to the action of the electric field in the direction from the electron extracting electrode 10 to the mesh electrode 30b, and thereby proceed toward the substrate 18. At this time, since the mesh electrode 30b is inclined in the direction in which the neutral clusters 15 are moved, the cluster ions 16 are subjected to a reduced force acting toward the center in a plane perpendicular to the direction in which the neutral clusters 15 are moved in the ionizing area. Therefore, the quantity of cluster ions 16 which reach the substrate 18 increases, and the quantity of cluster ions 16 which reach the space surrounding the substrate 18 decreases. This results in an increase in the efficiency of use of cluster ions and uniform distribution thereof.

In this embodiment, the electron extracting electrode 10 may have a truncated conical shape, like the mesh electrode, the truncated conical electron extracting electrode being disposed in such a manner as to be aligned with the mesh electrode.

Figure 8:
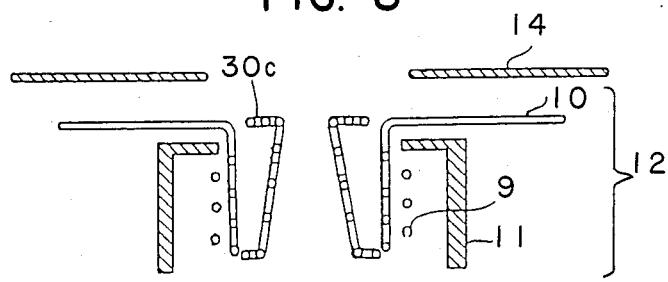
FIG. 8 is a cross-sectional view of the vicinity of the ionizing means of a thin film deposition apparatus showing a fourth embodiment of the present invention.

In this embodiment, the mesh electrode 30b has an accelerating electrode 14 side aperture which is larger than the crucible 4 side aperture. However, the accelerating electrode 14 side aperture of a mesh electrode 30c may be made smaller than the crucible 4 side aperture, as shown in FIG. 8. The provision of such a mesh electrode is also effective to reduce the energy that acts to extract the cluster ions in the transverse direction.

In this embodiment, the mesh electrode 30b has a truncated conical shape. However, it may have a truncated pyramidal shape, which allows it to have a polygonal aperture.

In each of the above-described embodiments, the mesh electrode 30a or 30b has applied to it the same electric potential as that of the ionizing filament 9. However, it does not necessarily have the same electric potential.

In any of the above-described embodiments, the substrate 18 is fixed. However, it may be rotated for the purpose of providing a uniform thin film in terms of film thickness and film quality in more effective way.

Furthermore, in any of the above-described embodiments, the mesh electrode 30a or 30b is made of tungsten. However, any high-melting metal may be used as the material of the mesh electrode.

Any of the above-described embodiments involves a cluster ion beam deposition apparatus in which the clusters are generated by bombarding the crucible 4 with electrons. However, the present invention may also be applied to a cluster ion beam deposition apparatus in which the clusters are generated by ejecting a normal temperature gas such as silane ($SiH_4$) from a gas chamber through a nozzle thereof into a vacuum chamber.

What is claimed is:

1. A thin film deposition apparatus comprising:
   a vacuum chamber;
   means for mounting a substrate within said vacuum chamber;
   a vapor generating source for ejecting vapors of a substance to be deposited on said substrate into said vacuum chamber and thereby generating clusters in each of which a large number of atoms in said vapors are loosely combined;
   an ionizing means for ionizing some of said clusters in an ionizing region of said chamber; and
   an accelerating electrode for accelerating the ionized cluster ions and causing them to collide with said substrate to deposit a thin film;
   wherein said ionizing means includes an ionizing filament for emitting thermoelectrons to ionize said clusters, and electron extracting electrode for accelerating said thermoelectrons toward said clusters, and an electron controlling electrode disposed opposite said electron extracting electrode from said filament for controlling the presence of the thermoelectrons in a central portion of said ionizing region.

2. A thin film deposition apparatus according to claim 1 wherein said electron controlling electrode is a mesh electrode.

3. A thin film deposition apparatus according to claim 2 wherein said mesh electrode is made of a high-melting metal.

4. A thin film deposition apparatus according to claim 3 wherein said high-melting metal is tungsten.

5. A thin film deposition apparatus according to claim 1 wherein said electron controlling electrode has the same electric potential as that of said ionizing filament.

6. A thin film deposition apparatus according to claim 1 wherein said vapor generating source has a side aperture and said electron controlling electrode has an accelerating electrode side aperture which is different from said vapor generating source side aperture and is a frustum in shape.

7. A thin film deposition apparatus according to claim 6 wherein said frustum is a frustum of cone.

8. A thin film deposition apparatus according to claim 6 wherein said frustum is a frustum of pyramid.

9. A thin film deposition apparatus according to claim 6 wherein said accelerating electrode side aperture is larger than said vapor generating source side aperture.

10. A thin film deposition apparatus according to claim 6 wherein said accelerating electrode side aperture is smaller than said vapor generating source side aperture.

* * * * *